United States Patent
Lindolf et al.

(10) Patent No.: US 6,501,283 B2
(45) Date of Patent: Dec. 31, 2002

(54) CIRCUIT CONFIGURATION FOR MEASURING THE CAPACITANCE OF STRUCTURES IN AN INTEGRATED CIRCUIT

(75) Inventors: Jürgen Lindolf, Friedberg (DE); Stefanie Schatt, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,804

(22) Filed: Jan. 16, 2001

(65) Prior Publication Data

US 2001/0033177 A1 Oct. 25, 2001

(30) Foreign Application Priority Data

Jan. 13, 2000 (DE) ......................... 100 01 129

(51) Int. Cl.⁷ .............................. G01R 27/26
(52) U.S. Cl. ............................. 324/679
(58) Field of Search ................. 324/676, 677, 324/678, 679, 765

(56) References Cited

U.S. PATENT DOCUMENTS 5,633,594 A  *  5/1997  Okada ..................... 324/678
5,920,199 A  *  7/1999  Sauer ..................... 324/452

OTHER PUBLICATIONS

"Investigation of Interconnect Capacitance Characterization Using Charge–Based Capacitance Measurement (CBCM) Technique and Three–Dimensional Simulation", Dennis Sylvester et al., IEEE Journal of Solid–State Circuits, Mar. 1998, pp. 449–453.

* cited by examiner

Primary Examiner—N. Le
Assistant Examiner—James Kerveros
(74) Attorney, Agent, or Firm—Laurence A. Greenberg; Werner H. Stemer; Gregory L. Mayback

(57) ABSTRACT

A circuit configuration for measuring the capacitance of structures in an integrated circuit having a test structure and a reference structure, includes first and second series circuits, each having two transistors connected in series and connected in parallel between supply terminals each providing one supply potential. The test structure is connected to a coupling node of the transistors of the first series circuit. The reference structure is connected to a coupling node of the transistors of the second series circuit. The supply terminals of the series circuits are connected to a controllable voltage source. A voltage-dependent differential capacitance measurement can be carried out on the test structure by using the circuit configuration.

7 Claims, 2 Drawing Sheets

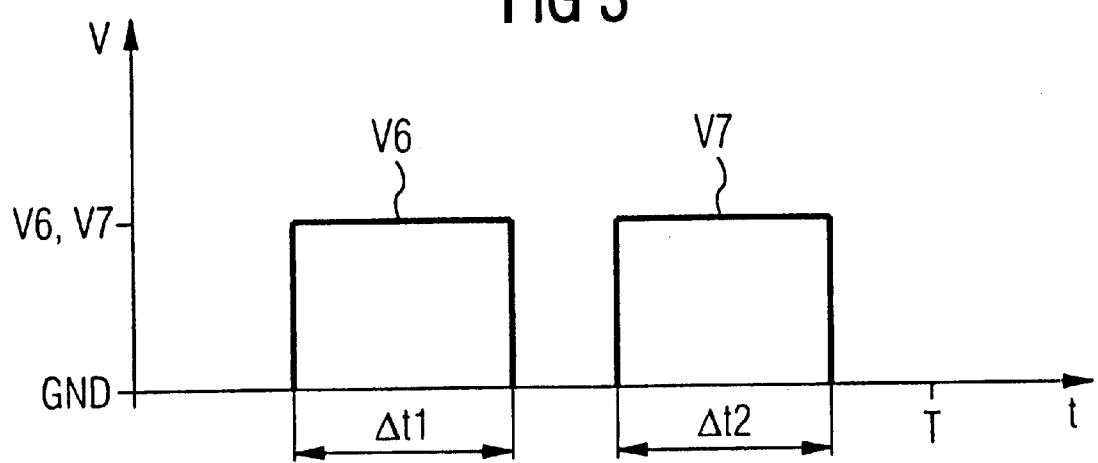

CIRCUIT CONFIGURATION FOR MEASURING THE CAPACITANCE OF STRUCTURES IN AN INTEGRATED CIRCUIT

BACKGROUND OF THE INVENTION

Field of the Invention

The present invention relates to a circuit configuration for measuring the capacitance of structures in an integrated circuit having a test structure and a reference structure. The circuit configuration includes first and second series circuits having transistors with controlled paths connected in series. The transistors of the series circuits are connected in parallel between supply terminals each supplying one supply potential. A terminal for the test structure is connected to a coupling node of the transistors of the first series circuit. A terminal for the reference structure is connected to a coupling node of the transistors of the second series circuit.

Integrated circuits have a structural, topographic construction, which is generally disposed in layers. For example, the integrated circuit has transistors and metal conductor tracks which are applied in layers one beside another or one above another on a semiconductor substrate. Modern integrated semiconductor circuits almost always have relatively small structure sizes and are operated with increasingly rising clock rates. The influence of capacitances on the signal speed generally increases with increasing transmission rates. Such capacitances can occur, for example, between the layers of metal conductor tracks and/or contact-making areas of transistors. In the course of the continued development of an integrated circuit, the aim is therefore to determine various types of capacitances and to influence them in a desired way.

Capacitances are determined, for example, by using large test structures. In addition, capacitances in integrated circuits can be determined through the use of the so-called charge-based capacitance measurement (CBCM) technique. That technique is described, for example, in a publication entitled "Investigation of Interconnect Capacitance Characterization Using Charge-Based Capacitance Measurement (CBCM) Technique and Three-Dimensional Simulation", by D. Sylvester, J. C. Chen and C. Hu, in IEEE J. Solid State Circuits, 33 (1998). The method described therein is applied in particular to the determination of different types of capacitances on metal conductor tracks in an integrated circuit. A measurement circuit having two transistor series circuits which are each connected to a test structure and, respectively, a reference structure, is also presented. Through the use of that circuit, relatively small structures or small capacitances in integrated circuits can in particular advantageously be determined. That is because, by including a reference structure, parasitic capacitances, for example on feed lines, can be compensated for in particular. In so doing it circumvents the metrological problem that, as a result of smaller and smaller values of the capacitances to be measured, corresponding calibration of measuring instruments is generally no longer sufficient to eliminate measurement errors.

The function of the circuit which is described resides in particular in that the test structure associated with a specific capacitance, and the reference structure placed in a relationship thereto, in each case have their charge reversed between two potentials. In that device, in each case the average charge reversal currents are measured and their difference is used to determine the capacitance to be determined.

Different types of capacitances generally occur at contacted areas of a transistor in an integrated circuit. They can, for example, be a so-called junction capacitance, a capacitance between source/drain regions and a substrate, a so-called thin layer capacitance, a capacitance between a gate region and the substrate, and a so-called overlap capacitance, a capacitance between the gate region and the respective source/drain region. Those capacitances generally depend on the respective potential value being applied. That means that those capacitances are voltage-dependent and therefore have to be determined in a voltage-dependent, differential capacitance measurement. Since, in the circuit described, the capacitances have their charges reversed between a fixed reference potential of the integrated circuit and a positive potential, voltage-dependent capacitance measurement is only possible to a restricted extent.

SUMMARY OF THE INVENTION

It is accordingly an object of the invention to provide a circuit configuration for measuring the capacitance of structures in an integrated circuit, which overcomes the hereinafore-mentioned disadvantages of the heretofore-known devices of this general type and with which a voltage-dependent, differential capacitance measurement is possible.

The reference structure has a construction which is essentially similar to the test structure. The construction may be of the layer type, for example when measuring capacitances at the terminals of a transistor disposed in layers. It is also possible to measure so-called lateral wire-wire capacitances in the test structure, using an appropriately similarly constructed reference structure which, in this case, contains only the wiring which is essential for the measurement.

With the foregoing and other objects in view there is provided, in accordance with the invention, in an integrated circuit having a test structure with a terminal and a reference structure with a terminal, a circuit configuration for measuring a capacitance of structures. The circuit configuration comprises supply terminals each supplying a respective supply potential. A controllable voltage source is connected to the supply terminals. First and second series circuits each have two transistors with controlled paths connected in series. The transistors of the first and second series circuits are connected in parallel between the supply terminals. A first coupling node is connected to the terminal for the test structure and is connected to the transistors of the first series circuit. A second coupling node is connected to the terminal for the reference structure and is connected to the transistors of the second series circuit.

A voltage-dependent, differential capacitance measurement can be carried out by connecting the supply terminals of the two series circuits to the controllable voltage source.

For example, the supply voltages are set by the voltage source in such a way that the result is a relative potential difference of 0.1 V, for example. The level of the supply voltages can be varied in discrete steps between the measurements. In this way, different working points are established on the capacitances to be measured, which means that a differential capacitance measurement can be carried out.

In accordance with another feature of the invention, in each case PMOS transistors are used for charging each of the test structure and the reference structure, and NMOS transistors are used for discharging the test and reference structures. When the supply voltage falls, there is the risk that the gate voltage which is present will rise above the threshold voltage of the PMOS transistor. Lowering the gate voltage in this regard to negative values in order to avoid potential shifts on the entire integrated circuit is generally not suitable. NMOS transistors are provided in the circuit configuration according to the invention to ensure complete charging of the test and reference structures, even at potential values which are close to the reference potential of the integrated circuit. The gate connections of the respective NMOS transistors can be controlled by a positive potential in such a way that the respective transistor is located in the low-resistance range, even at a low supply potential.

In accordance with a concomitant feature of the invention, in a similar way, the circuit configuration for setting working points with a negative potential value has NMOS transistors each having an insulated p-doped trough. The insulated trough, which is located in a likewise p-doped substrate, in this case is connected to a corresponding negative potential.

Other features which are considered as characteristic for the invention are set forth in the appended claims.

Although the invention is illustrated and described herein as embodied in a circuit configuration for measuring the capacitance of structures in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph showing a signal relating to the circuit configuration of FIG. 2.

DESCRIPTION OF THE PREFERRED EMBODIMENTS

Figure 1:
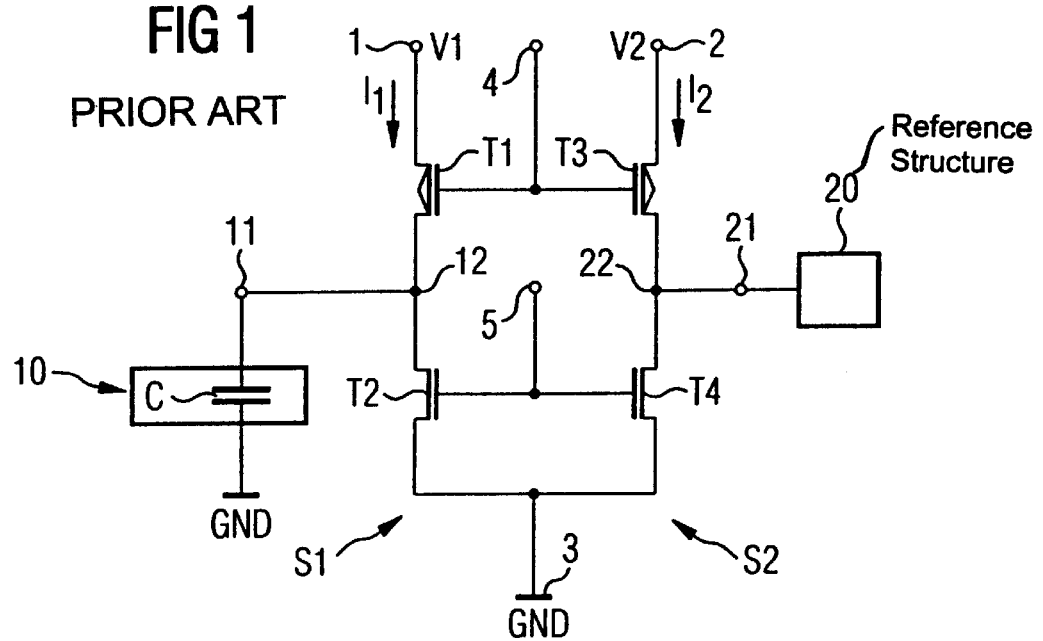
FIG. 1 is a schematic and block diagram of a circuit configuration for measuring the capacitance of structures in an integrated circuit.

Referring now to the figures of the drawings in detail and first, particularly, to FIG. 1 thereof, there is seen a circuit configuration for measuring the capacitance of structures, in an integrated circuit according to the prior art. The circuit configuration has a first series circuit S1 and a second series circuit S2, each of which includes two respective transistors T1, T2 and T3, T4 having controlled paths connected in series. The series circuits S1 and S2 are connected between respective supply terminals 1 and 2 and 3. A positive supply potential V1, V2 equal to VDD is, for example, applied to the supply terminals 1 and 2. A fixed reference potential GND of the integrated circuit is, for example, applied to the supply terminal 3. A terminal 11 for a test structure 10 is connected to a coupling node 12 of the transistors T1 and T2 of the series circuit S1. The test structure 10 is illustrated schematically by a capacitance C. A terminal 21 for a reference structure 20 is connected to a coupling node 22 of the transistors T3 and T4 of the series circuit S2.

In order to measure the capacitance C, control terminals 4 and 5, of the transistors are driven appropriately with mutually non-overlapping signals. The test structure 10 and the reference structure 20 are respectively charged and discharged through the use of currents I1 and I2. In this case, driving the terminals 4 and 5 appropriately avoids a short-circuit current flowing between the transistors connected in series in the respective series circuit. The difference between the currents I1 and I2 to be measured is directly proportional to the capacitance C to be measured. The capacitance C is calculated in this case in accordance with the formula:

$$C \cdot VDD \cdot f = I1 - I2.$$

In this case, the measured currents I1 and I2 are measured average values and f is the frequency of the clock cycle of the measurement. The resolution which can be achieved during the measurement essentially depends on the configuration of the two series circuits S1 and S2. If these are dimensioned to be relatively small and are disposed relatively close to one another on the integrated circuit, the influence of parasitic capacitances on the measurement result can be reduced significantly. As described at the outset, such a circuit configuration is primarily used for measuring those capacitances along metal conductor tracks which are generally not dependent on the level of the voltage applied to the metal conductor tracks.

Figure 2:
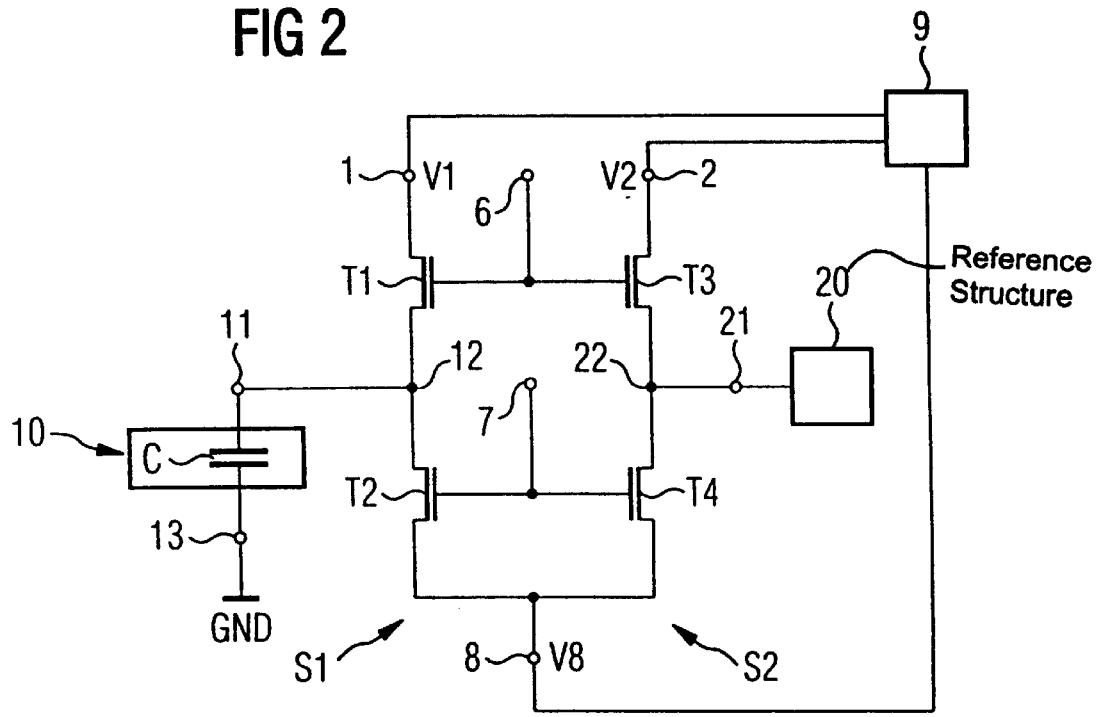
FIG. 2 is a schematic and block diagram of a circuit configuration according to the invention for voltage-dependent, differential capacitance measurement.

FIG. 2 shows a circuit configuration according to the invention for voltage-dependent, differential capacitance measurement. The circuit configuration has a largely similar structural construction to the circuit configuration illustrated in FIG. 1. As opposed to the circuit according to FIG. 1, in FIG. 2 supply terminals 1, 2 and 8, which are connected to a controllable voltage source 9, are at controllable supply voltages V1, V2, V8. A further terminal 13 of the test structure 10 is also connected to the fixed reference potential GND of the integrated circuit. A positive supply potential VDD is, for example, applied to the terminals 1 and 2. A potential VSS which is reduced by comparison is, for example, applied to the terminal 8.

According to the principle of the measurement of the capacitance C explained with regard to FIG. 1, the result at the terminal 11 is a working point:

A=(VDD+VSS)/2 (average of VDD and VSS).

VDD is, for example, defined as VDD=VSS +0.1 V.

In addition, contrary to the circuit configuration of FIG. 1, the circuit configuration of FIG. 2 has NMOS transistors T1 and T3. In order to ensure a full voltage range up to VDD on the capacitance C, the gate voltages of the transistors T1 and T3 are set to be about one threshold voltage higher than VDD. NMOS transistors which have an insulated P trough are used for negative working points of the capacitance C.

FIG. 3 shows a signal graph for the circuit configuration of FIG. 2. In each case, potential values V6 and V7 are applied to terminals 6 and 7 for discrete time slots Δt1 and Δt2. In order to avoid a short-circuit current between the transistors T1 and T2 as well as T3 and T4, respectively, a time overlap of the potentials V6 and V7 applied to the terminals 6 and 7 is to be avoided. A typical clock cycle during a measurement is, for example, a time T=2 μs. Accordingly, Δt1 and Δt2 are, for example, each set to be 900 ns. The potentials V6 and V7 are, for example, 3.5 V for a voltage VDD=2.3 V.

The circuit configuration according to the invention can advantageously be used for measuring NMOS junction capacitances and NMOS overlap capacitances. Moreover, the circuit can advantageously be used for measuring NMOS thin layer capacitances and voltage-dependent capacitances along metal conductor tracks.

We claim:

1. In an integrated circuit having a test structure with a terminal and a reference structure with a terminal, a circuit configuration for measuring a capacitance of structures, comprising:
   supply terminals each supplying a respective supply potential;
   a controllable voltage source connected to said supply terminals;
   first and second series circuits each having two transistors with controlled paths connected in series, said transistors of said first and second series circuits connected in parallel between said supply terminals;
   a first coupling node connected to the terminal for the test structure and connected to said transistors of said first series circuit; and
   a second coupling node connected to the terminal for the reference structure and connected to said transistors of said second series circuit.

2. The circuit configuration according to claim 1, wherein said transistors of said series circuits are NMOS transistors.

3. The circuit configuration according to claim 2, wherein said NMOS transistors have an insulated p-doped trough.

4. The circuit configuration according to claim 1, wherein the test structure has NMOS structures.

5. The circuit configuration according to claim 1, wherein the test structure has metal conductor tracks.

6. The circuit configuration according to claim 1, including a further terminal of the test structure connected to a fixed reference potential of the integrated circuit.

7. A method of measuring a voltage-dependent differential capacitance of structures in an integrated circuit having a test structure with a terminal and a reference structure with a terminal, comprising:
   providing supply terminals each supplying a respective supply potential;
   connected a controllable voltage source to the supply terminals;
   providing first and second series circuits each having two transistors with controlled paths connected in series,
   connecting the transistors of the first and second series circuits in parallel between the supply terminals;
   connecting a first coupling node to the terminal for the test structure and to the transistors of the first series circuit;
   connecting a second coupling node to the terminal for the reference structure and to the transistors of the second series circuit;
   measuring a plurality of capacitance of the test structure; and
   varying levels of the supply potentials in discrete steps between the measurements of the plurality of capacitances.

* * * * *